United States Patent
Lin et al.

(10) Patent No.: US 9,647,424 B2
(45) Date of Patent: May 9, 2017

(54) SINGLE MODE REFLECTOR USING A NANOBEAM CAVITY

(71) Applicant: Oracle International Corporation, Redwood Shores, CA (US)

(72) Inventors: Shiyun Lin, San Diego, CA (US); Xuezhe Zheng, San Diego, CA (US); Ying Luo, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 24 days.

(21) Appl. No.: 14/881,741

(22) Filed: Oct. 13, 2015

(65) Prior Publication Data

US 2017/0104307 A1 Apr. 13, 2017

(51) Int. Cl.

| | |
|---|---|
| *H01S 5/00* | (2006.01) |
| *H01S 5/20* | (2006.01) |
| *G02B 6/10* | (2006.01) |
| *G02B 6/122* | (2006.01) |
| *G02B 6/125* | (2006.01) |
| *G02B 6/136* | (2006.01) |

(Continued)

(52) U.S. Cl.
CPC ............ *H01S 5/2031* (2013.01); *G02B 6/107* (2013.01); *G02B 6/125* (2013.01);
(Continued)

(58) Field of Classification Search
CPC ...... H01S 5/223; H01S 5/1209; H01S 5/1212; H01S 5/1215; H01S 5/1231; H01S 5/12;
(Continued)

(56) References Cited

U.S. PATENT DOCUMENTS

2010/0322555 A1* 12/2010 Vermeulen ......... G02B 6/12007
  385/28
2013/0301981 A1* 11/2013 Li .......................... G02B 6/136
  385/14

(Continued)

OTHER PUBLICATIONS

Zheng et al.; "Efficient WDM laser sources towards terabyte/s silicon photonic interconnects," J. Light. Technol., 2013.

(Continued)

*Primary Examiner* — Kinam Park
(74) *Attorney, Agent, or Firm* — Park, Vaughan, Fleming & Dowler LLP

(57) ABSTRACT

An integrated circuit includes an optical reflector with one or two bus optical waveguides and a one-dimensional, photonic crystal nanobeam cavity to provide single-mode reflection with a narrow bandwidth. In particular, the nanobeam cavity may be implemented on a nanobeam-cavity optical waveguide (such as a channel or ridge optical waveguide), which is optically coupled to the one or two bus optical waveguides. The nanobeam-cavity optical waveguide may include notches along a symmetry axis of the nanobeam-cavity optical waveguide that are partially etched from edges of the nanobeam-cavity optical waveguide toward a center of the nanobeam-cavity optical waveguide. Furthermore, a fill factor of the notches may vary as a function of location along the symmetry axis, while a pitch of the notches is unchanged, to define the nanobeam cavity.

20 Claims, 12 Drawing Sheets

(51) Int. Cl.
*G02B 6/12* (2006.01)
*G02B 6/293* (2006.01)
*H01S 5/14* (2006.01)
*H01S 5/12* (2006.01)
*H01S 5/223* (2006.01)
*H01S 5/026* (2006.01)
*H01S 5/10* (2006.01)
*H01S 5/40* (2006.01)

(52) U.S. Cl.
CPC ....... *G02B 6/12007* (2013.01); *G02B 6/1228* (2013.01); *G02B 6/136* (2013.01); *G02B 6/29332* (2013.01); *H01S 5/026* (2013.01); *H01S 5/0268* (2013.01); *H01S 5/101* (2013.01); *H01S 5/1014* (2013.01); *H01S 5/1017* (2013.01); *H01S 5/1042* (2013.01); *H01S 5/12* (2013.01); *H01S 5/1209* (2013.01); *H01S 5/1212* (2013.01); *H01S 5/1215* (2013.01); *H01S 5/1231* (2013.01); *H01S 5/14* (2013.01); *H01S 5/141* (2013.01); *H01S 5/223* (2013.01); *H01S 5/4068* (2013.01); *G02B 2006/12104* (2013.01)

(58) Field of Classification Search
CPC .......... H01S 5/141; H01S 5/14; H01S 5/0268; H01S 5/026; H01S 5/101; H01S 5/1014; H01S 5/1017; H01S 5/1042; H01S 5/2031; H01S 5/4068
See application file for complete search history.

(56) References Cited

U.S. PATENT DOCUMENTS

2014/0226684 A1* 8/2014 Krishnamoorthy ..... H01S 5/021
372/20
2014/0268312 A1* 9/2014 Zheng ................... H01S 5/1028
359/344
2014/0321502 A1* 10/2014 Ahmed .................. G01K 11/00
374/130
2015/0303653 A1* 10/2015 Tanaka ................. G02B 6/1228
398/200

OTHER PUBLICATIONS

Nemoto et al.; "Narrow spectral linewidth wavelength tunable laser with Si photonicwire waveguide ring resonators," in The 9th International Conference on Group IV Photonics (GFP), 2012, pp. 216-218.

Fujioka et al.; "Compact and Low Power Consumption Hybrid Integrated Wavelength Tunable Laser Module Using Silicon Waveguide Resonators," J. Light. Technol., Nov. 2010.

Lin et al.; "Vertical-coupled high-efficiency tunable III-V—CMOS SOI hybrid external-cavity laser.," Opt. Express, vol. 21, No. 26, pp. 32425-32431, 2013.

Tan et al.; "Wide bandwidth, low loss 1 by 4 wavelength division multiplexer on silicon for optical interconnects.," Opt. Express, vol. 19, No. 3, pp. 2401-2409, 2011.

Akiyama et al.; "Wavelengthtuning-free 10-Gb/s operation of a silicon-integrated resonantly-enhanced modulator and single-mode laser," in the 9th International Conference on Group IV Photonics (GFP), 2012, pp. 358-360.

Deotare et al.; "High quality factor photonic crystal nanobeam cavities," Appl. Phys. Lett., vol. 94, No. 12, p. 121106, 2009.

Kim et al.; "Tunable transmission resonant filter and modulator with vertical gratings," J. Light. Technol., vol. 25, No. 5, pp. 1147-1151, 2007.

Hastings et al.; "Optical waveguides with apodized sidewall gratings via spatial-phase-locked electron-beam lithography," J. Vac. Sci. Technol. B Microelectron. Nanom.

* cited by examiner

SINGLE MODE REFLECTOR USING A NANOBEAM CAVITY

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure relates to techniques for reflecting optical signals. More specifically, the present disclosure relates to a single-mode optical reflector based on a nanobeam cavity.

Related Art

Silicon photonics is a promising technology that can provide large communication bandwidth, large density, low latency and low power consumption for inter-chip and intra-chip connections. In the last few years, significant progress has been made in developing low-cost components for use in inter-chip and intra-chip silicon-photonic connections, including: high-bandwidth efficient silicon modulators, low-loss optical waveguides, wavelength-division-multiplexing (WDM) components, and high-speed CMOS optical-waveguide photo-detectors.

Nonetheless, a high-efficiency, single-mode light source for use in silicon photonics remains a challenge. One approach for implementing such a light source is a hybrid external cavity laser, in which a III-V material section is used as an electrically pumped optical gain medium, and a silicon minor is used as the other reflector in the external cavity, as well as an output coupler. However, it has proven difficult to implement an integrated reflector with a narrow bandwidth and a single mode.

For example, integrated ring-resonator reflectors have been demonstrated. However, ring-resonator reflectors have periodic reflection peaks as a function of wavelength, which can cause optical mode instability because of competing optical modes within the gain spectrum of the laser. Moreover, controlling ring-resonator reflectors can be complicated and the control often requires significant thermal tuning power. Furthermore, ring-resonator reflectors can have a large footprint, which reduces their pitch.

A distributed Bragg reflector (DBR) is another type of integrated mirror that reflects a single wavelength. However, a very weak modulation of the Bragg grating is needed for a narrow bandwidth, which usually requires a large number of grating periods that make the DBR undesirably long. Furthermore, while the combination of a ring-resonator reflector and a DBR can provide a narrow bandwidth and single-mode reflection, the resulting reflector typically has a large footprint.

Hence, what is needed is an integrated reflector without the above-described problems.

SUMMARY

One embodiment of the present disclosure provides an integrated circuit that includes an optical receiver. This integrated circuit includes: a substrate, a buried-oxide (BOX) layer disposed on the substrate, and a semiconductor layer disposed on the BOX layer, where the semiconductor layer includes the optical reflector. The optical reflector includes: a first bus optical waveguide, and a nanobeam-cavity optical waveguide optically coupled to the first bus optical waveguide. Moreover, the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide. Furthermore, a fill factor of the notches varies as a function of location along the symmetry axis, while a pitch of the notches is unchanged, to define a nanobeam cavity.

Note that the nanobeam-cavity optical waveguide may include a ridge optical waveguide or a channel optical waveguide.

Moreover, the first bus optical waveguide may be curved.

Furthermore, tapering of the nanobeam-cavity optical waveguide associated with variation of the fill factor along the symmetry axis may be adiabatic. Additionally, the fill factor at a midpoint of the nanobeam-cavity optical waveguide may be greater than fill factors at locations distal from the midpoint in either direction along the symmetry axis. For example, the fill factors at locations along the symmetry axis that are symmetric about the midpoint may be approximately equal.

In some embodiments, the optical reflector is structured to reflect a specific wavelength.

Moreover, the nanobeam-cavity optical waveguide may include less than a predefined number of notches and the optical reflector may have a Q factor greater than a predefined value.

Furthermore, the optical reflector may include a second bus optical waveguide that is optically coupled to the nanobeam-cavity optical waveguide. In some embodiments, the optical coupling between the nanobeam-cavity optical waveguide and the first bus optical waveguide is different than the optical coupling between the nanobeam-cavity optical waveguide and the second bus optical waveguide.

Additionally, the integrated circuit may include an external cavity laser, where the optical reflector is a reflector at one end of the external cavity laser and, in part, defines an optical cavity in the external cavity laser.

Note that the substrate, the BOX layer and the semiconductor layer may constitute a silicon-on-insulator technology.

Another embodiment provides a system that includes: a processor; a memory that stores a program module; and the integrated circuit. During operation, the program module is executed by the processor.

Another embodiment provides a method for reflecting a wavelength in an output optical signal, which may be performed by an optical reflector in an integrated circuit. During operation, a bus waveguide in the optical reflector conveys an input optical signal having multiple wavelengths, where the bus optical waveguide is defined in a semiconductor layer, the semiconductor layer is disposed on a buried-oxide (BOX) layer and the BOX layer is disposed on a substrate. Then, the input optical signal is optically coupled to a nanobeam-cavity optical waveguide in the optical reflector, where the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide. Note that a fill factor of the notches varies as a function of location along the symmetry axis, while a pitch of the notches is unchanged, to define a nanobeam cavity. Next, the nanobeam-cavity optical waveguide reflects the wavelength in the output optical signal.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, a system that includes the integrated circuit, and a method for reflecting a wavelength in an output optical signal are described. The integrated circuit may include an optical reflector with one or two bus optical waveguides and a one-dimensional, photonic crystal nanobeam cavity. In particular, the nanobeam cavity may be implemented on a nanobeam-cavity optical waveguide (such as a channel or ridge optical waveguide), which is optically coupled to the one or two bus optical waveguides. The nanobeam-cavity optical waveguide may include notches along a symmetry axis of the nanobeam-cavity optical waveguide that are partially etched from edges of the nanobeam-cavity optical waveguide toward a center of the nanobeam-cavity optical waveguide. Furthermore, a fill factor of the notches may vary as a function of location along the symmetry axis, while a pitch of the notches is unchanged, to define the nanobeam cavity.

The optical reflector may provide single-mode reflection with a narrow bandwidth. Moreover, the optical reflector may have ultra-low intrinsic loss and low insertion loss. Note that the resonance wavelength may be determined by the pitch and the fill factor. These two factors can be designed independently and, therefore, may provide increased design flexibility. In addition, the optical reflector may be ultra-compact, and thus may require less tuning power for a given wavelength tuning range and may facilitate a higher density of integration. The integrated circuit with the optical reflector may be useful in conjunction with reflective semiconductor optical amplifiers (RSOA s) to make a one-dimensional array of hybrid external cavity laser sources. Consequently, the integrated circuit may facilitate silicon photonic links for use in applications such as wavelength-division multiplexing.

Figure 1:
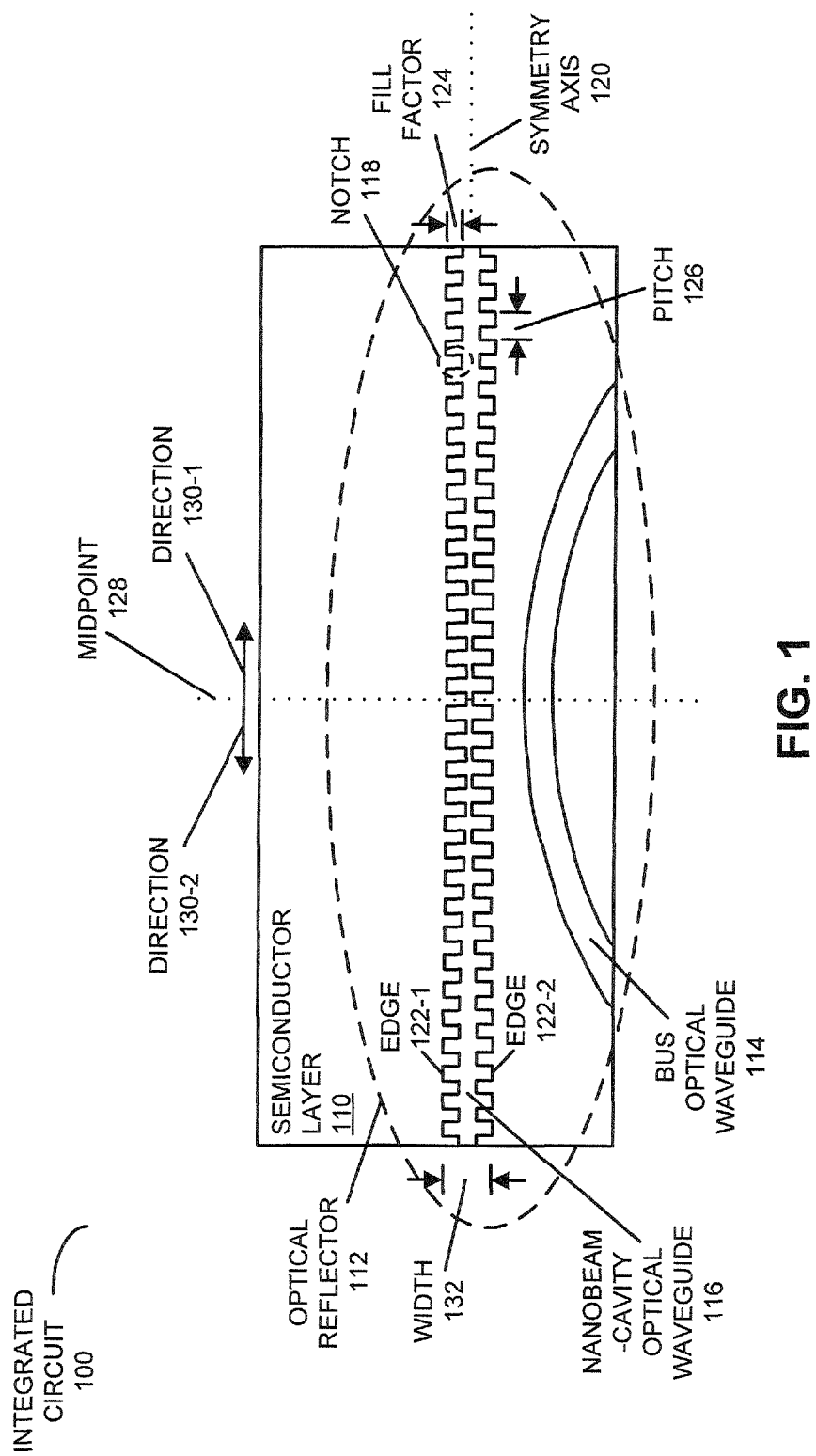
FIG. 1 is a block diagram illustrating a top view of an integrated circuit in accordance with an embodiment of the present disclosure.

We now describe embodiments of the integrated circuit. FIG. 1 presents a block diagram illustrating a top view of an integrated circuit 100. This integrated circuit includes an optical reflector 112 that is defined, at least in part, in a semiconductor layer 110 (which is described further below with reference to FIG. 9). This optical reflector includes: a bus optical waveguide 114, and a nanobeam-cavity optical waveguide 116 optically coupled to bus optical waveguide 114. Moreover, nanobeam-cavity optical waveguide 116 includes notches (such as notch 118) along a symmetry axis 120 of nanobeam-cavity optical waveguide 116 that are partially etched from edges 122 of nanobeam-cavity optical waveguide 116 toward a center of nanobeam-cavity optical waveguide 116. Furthermore, a depth of the etching or a fill factor (such as fill factor 124) of the notches varies as a function of location along symmetry axis 120 while a pitch 126 of the notches is unchanged to define a nanobeam cavity.

Note that nanobeam-cavity optical waveguide 116 may include a ridge optical waveguide or a channel optical waveguide.

Bus optical waveguide 114 may be designed to have a phase-matching condition with the fundamental mode of the nanobeam cavity. Moreover, as described further below with reference to FIGS. 2 and 3, bus optical waveguide 114 may be curved. For example, the radius of curvature may be 5 μm. Using a bent or curved bus optical waveguide may enhance the optical coupling with the fundamental optical mode while suppressing the optical coupling to the higher-order optical mode, which has a field maximum away from the center of the nanobeam cavity. For a single bus optical waveguide design, optical reflector 112 may work in the over-coupled regime to extract partial power from the through port of bus optical waveguide 114.

Thus, optical reflector 112 may reflect a wavelength (e.g., a single mode). In particular, optical reflector 112 may have a large free-spectral range so that it reflects the fundamental optical mode. Consequently, optical reflector 112 may be a band-stop optical device.

In some embodiments, tapering of nanobeam-cavity optical waveguide 116 associated with variation of the fill factor along symmetry axis 120 is gradual or adiabatic in order to reduce loss. Additionally, the fill factor at a midpoint 128 of nanobeam-cavity optical waveguide 116 may be greater than fill factors at locations distal from midpoint 128 in either of directions 130 along symmetry axis 120. For example, the fill factors at locations along symmetry axis 120 that are symmetric about midpoint 128 may be approximately equal. Note that by changing the fill factor, a band-edge optical mode may be confined proximate to midpoint 128 of the nanobeam cavity because of the gradually increasing effective index of refraction on both sides. In an exemplary embodiment, nanobeam-cavity optical waveguide 116 has a width 132 of 700 nm, a pitch 126 of 300 nm, and a fill factor that varies from 70% at midpoint 128 to 50% at the distal locations.

Moreover, nanobeam-cavity optical waveguide 116 may include less than a predefined number of notches (such as 60 or 100) and the optical reflector may have a Q factor greater than a predefined value (such as $10^4$-$10^7$ or a loss of a few tens of dB/cm). Such a nanobeam-cavity optical waveguide may result in a length of optical reflector 112 that is less than 20 μm.

Figure 2:
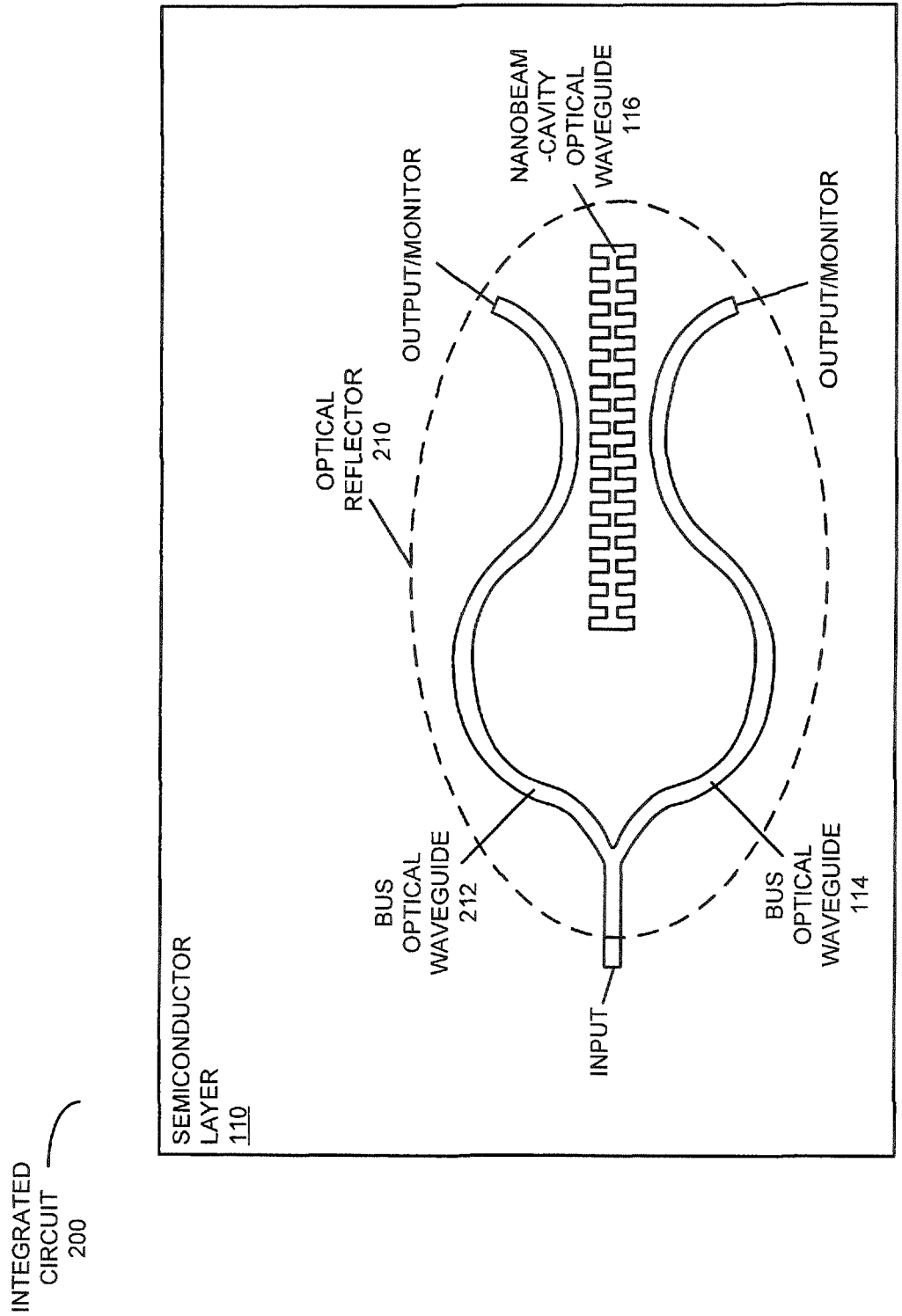
FIG. 2 is a block diagram illustrating a top view of an integrated circuit in accordance with an embodiment of the present disclosure.
Figure 10:
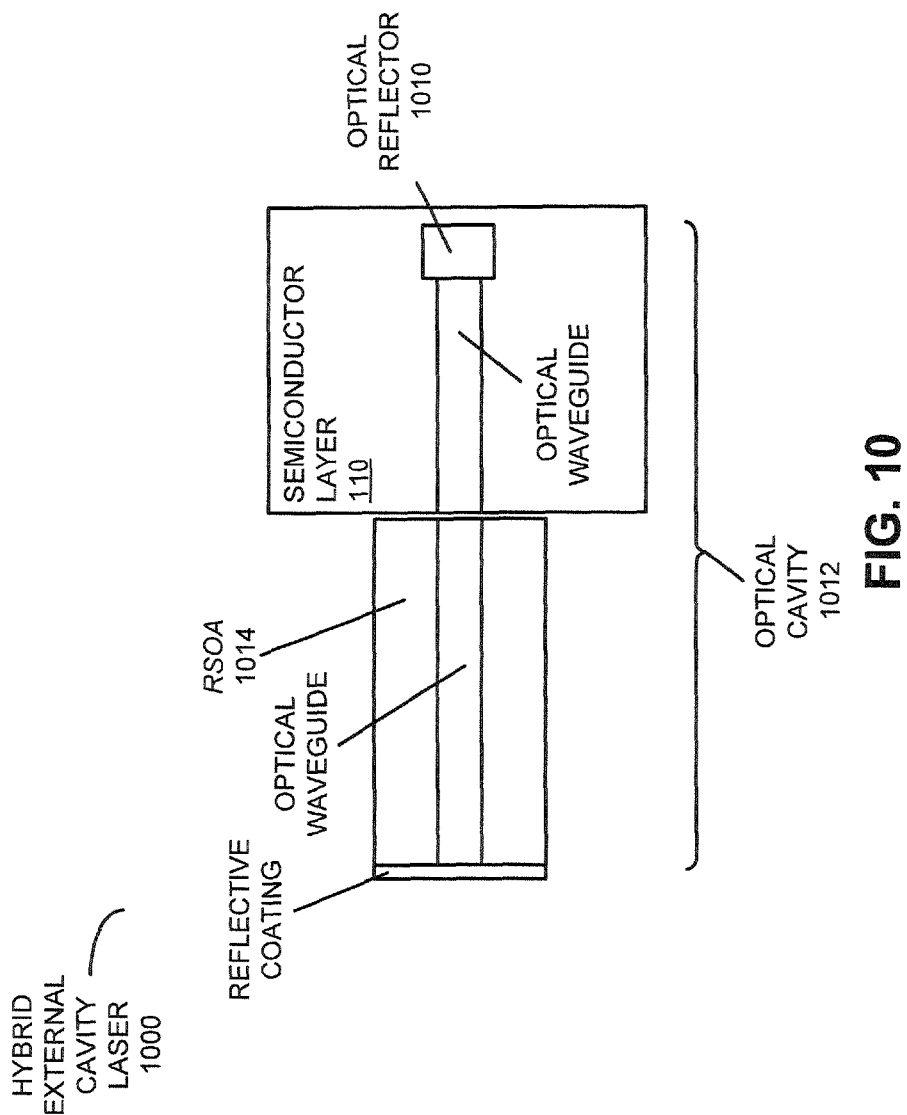
FIG. 10 is a block diagram illustrating a side view of a hybrid external cavity laser in accordance with an embodiment of the present disclosure.

Optical reflector 112 may include a second bus optical waveguide that is optically coupled to nanobeam-cavity optical waveguide 116 (which, as described further below with reference to FIG. 10, may be used to circulate an optical signal in a hybrid external cavity laser). This is shown in FIG. 2, which presents a block diagram illustrating a top view of an integrated circuit 200. In particular, optical reflector 210 includes bus optical waveguide 212, and may implement a Y-junction.

Note that the optical coupling between nanobeam-cavity optical waveguide 116 and bus optical waveguide 114 may be the same as the optical coupling between nanobeam-cavity optical waveguide 116 and bus optical waveguide 212. This may define a partial reflector. For example, with optical coupling gaps of 200, 300 and 400 nm between bus optical waveguides 114 and 212 and the nanobeam-cavity optical waveguide 116, Q factors of 1500, 4000 and 10,000 can been obtained.

Figure 3:
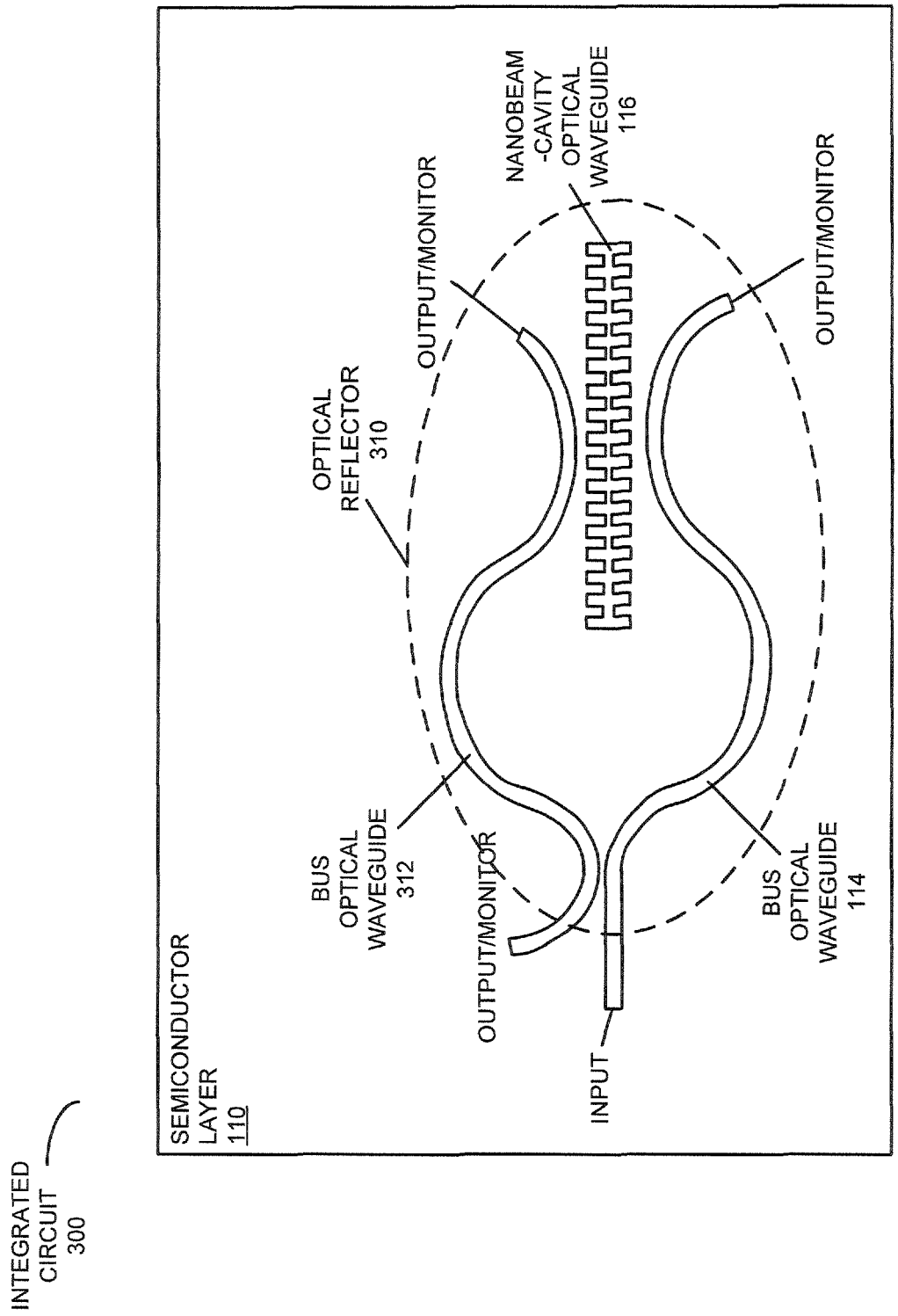
FIG. 3 is a block diagram illustrating a top view of an integrated circuit in accordance with an embodiment of the present disclosure.

Alternatively, as shown in FIG. 3, which presents a block diagram illustrating a top view of an integrated circuit 300, the optical coupling between nanobeam-cavity optical waveguide 116 and bus optical waveguide 114 in optical reflector 310 may be different than the optical coupling between nanobeam-cavity optical waveguide 116 and bus optical waveguide 312. This may define a full reflector based on a directional coupler.

(More generally, an arbitrary ring-resonator reflector design may be implemented using the nanobeam cavity, with the benefit of single-wavelength reflection and a small footprint.)

Figure 4:
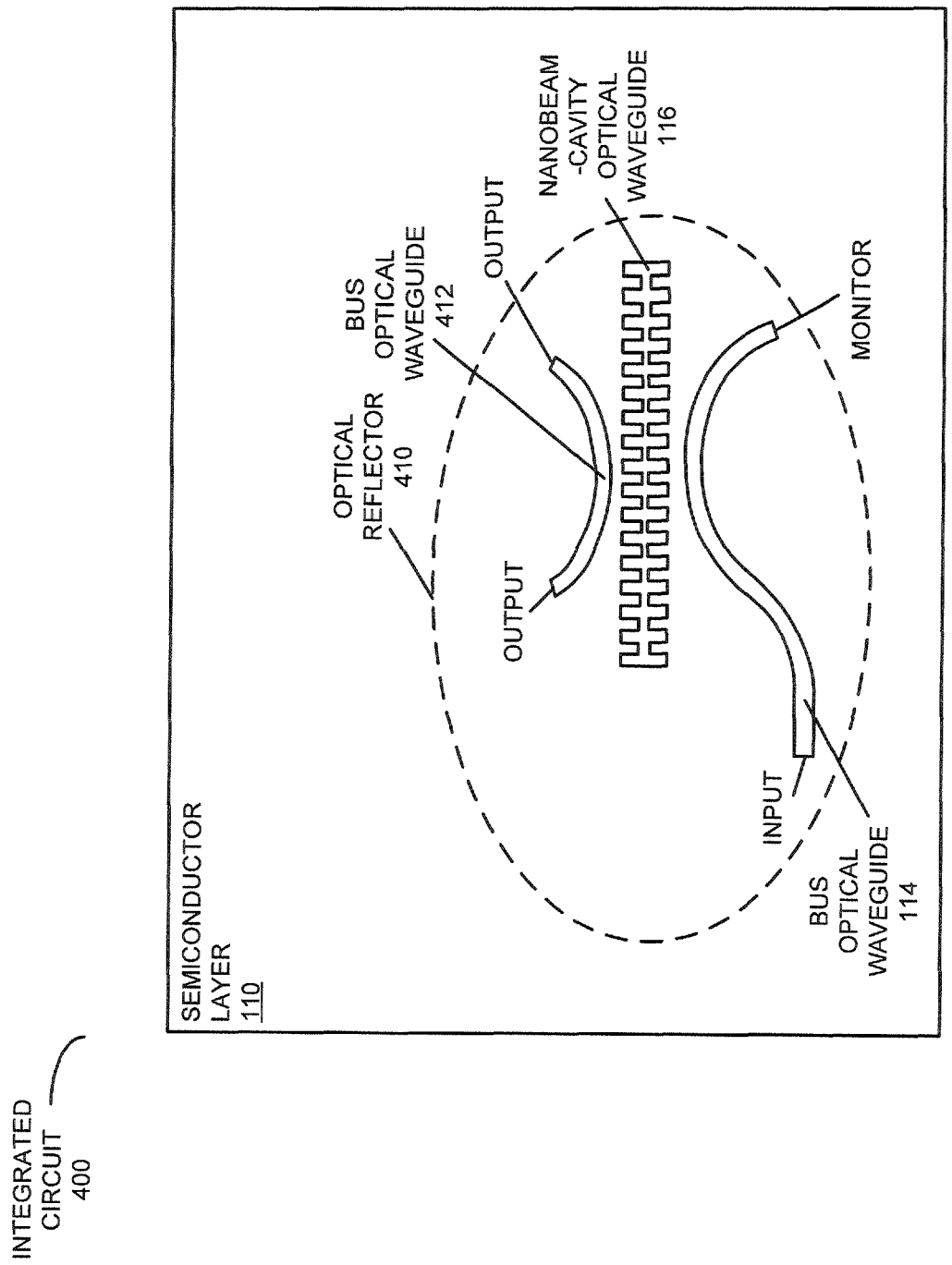
FIG. 4 is a block diagram illustrating a top view of an integrated circuit in accordance with an embodiment of the present disclosure.
Figure 5:
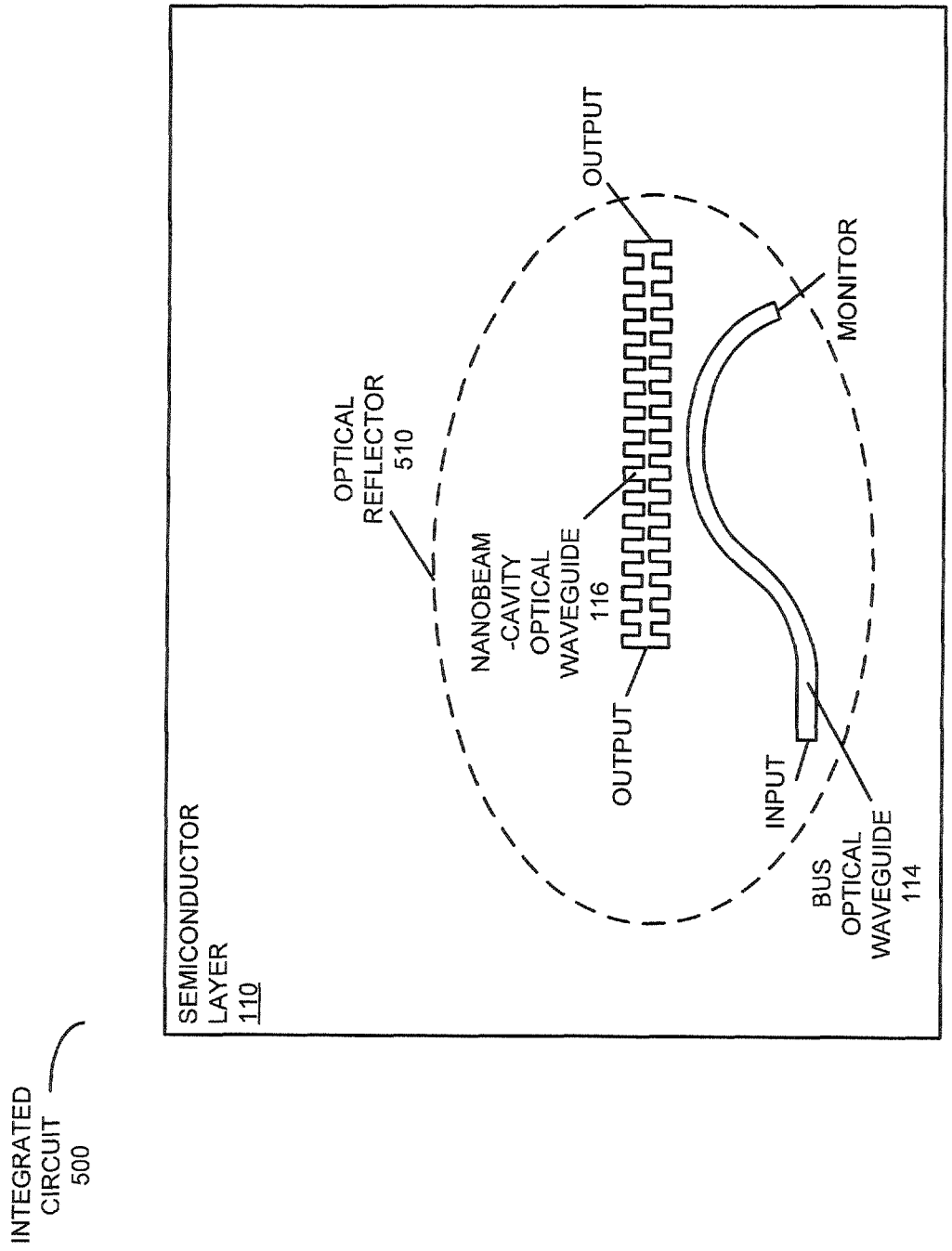
FIG. 5 is a block diagram illustrating a top view of an integrated circuit in accordance with an embodiment of the present disclosure.
Figure 6:
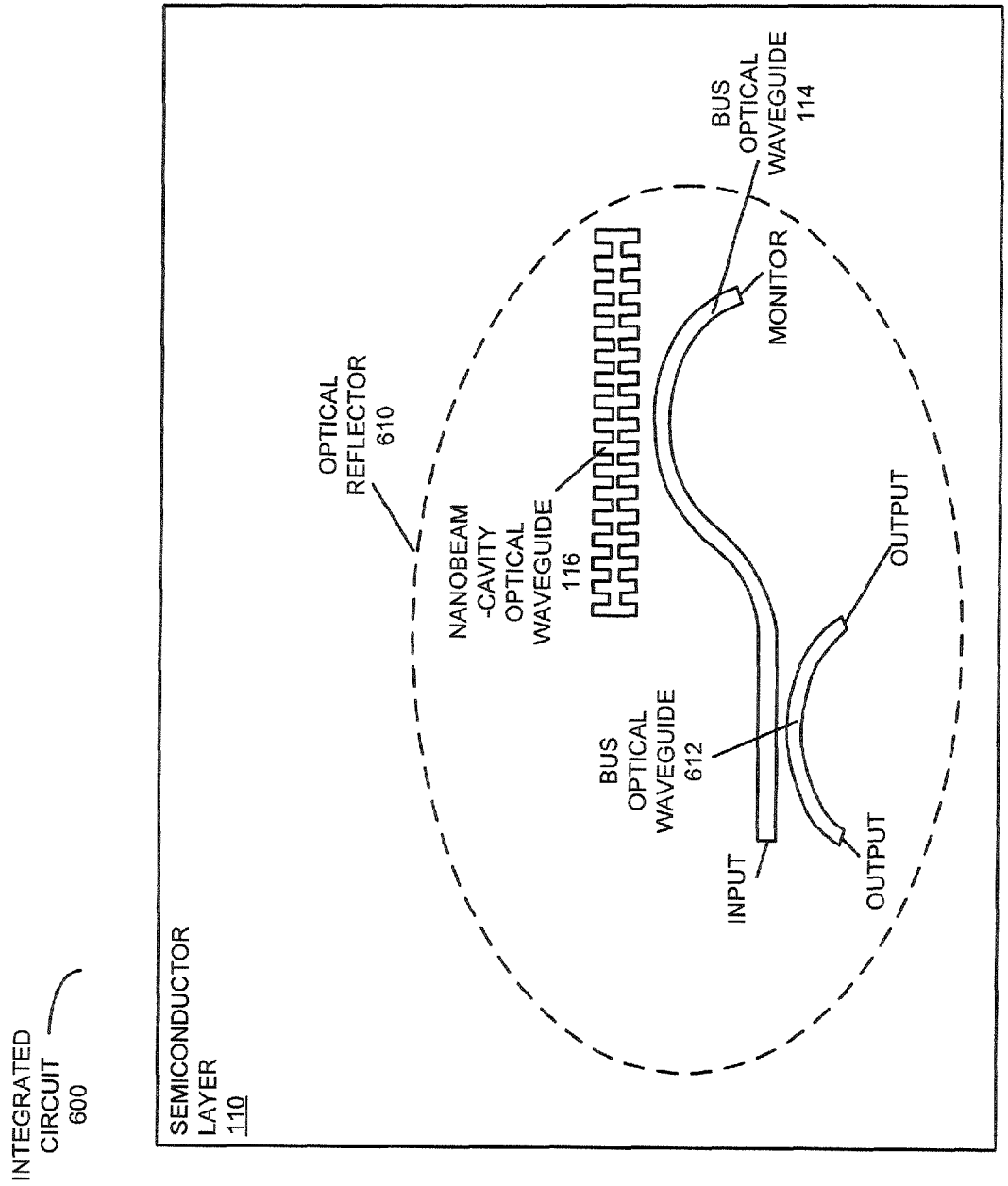
FIG. 6 is a block diagram illustrating a top view of an integrated circuit in accordance with an embodiment of the present disclosure.

Additional embodiments are shown in FIGS. 4-6. In FIG. 4, which presents a block diagram illustrating a top view of an integrated circuit 400, bus optical waveguide 412 in optical reflector 410 may extracts light from nanobeam-cavity optical waveguide 116 as outputs. Note that the output power coupling ratio can be flexibly controlled by changing the gaps between optical bus waveguides 114 and 412 and nanobeam-cavity optical waveguide 116.

Alternatively, as shown in FIG. 5, which presents a block diagram illustrating a top view of an integrated circuit 500, sides of nanobeam-cavity optical waveguide 116 in optical reflector 510 can be used for outputs. In this embodiment, the output power coupling ratio can be controlled by changing the number of periods of the notches. Note that light is less confined in the nanobeam cavity when the number of notches is reduced and, therefore, more power leaks from the outputs. In order to reduce the loss, the filling factor of the notches may be reduced from 70% in the midpoint to 0% on the sides. This approach can be applied on only one side of the nanobeam cavity and, thus, an embodiment with a reduced filling factor may provide a single output port.

Furthermore, as shown in FIG. 6, which presents a block diagram illustrating a top view of an integrated circuit 600, bus optical waveguide 612 may extract light from optical reflector 610 as outputs.

Referring back to FIG. 2, during operation, light may come in from the left on bus optical waveguide 212 and may optically couple to nanobeam-cavity optical waveguide 116. Then, the light may reflect back from right to left, and may optically couple out in an anti-clockwise path. Similarly, the opposite circulation may occur on bus optical waveguide 114 for the clockwise path. Alternatively, referring back to FIG. 3, the light may optically couple across nanobeam-cavity optical waveguide 116 to bus optical waveguide 312.

Figure 7:
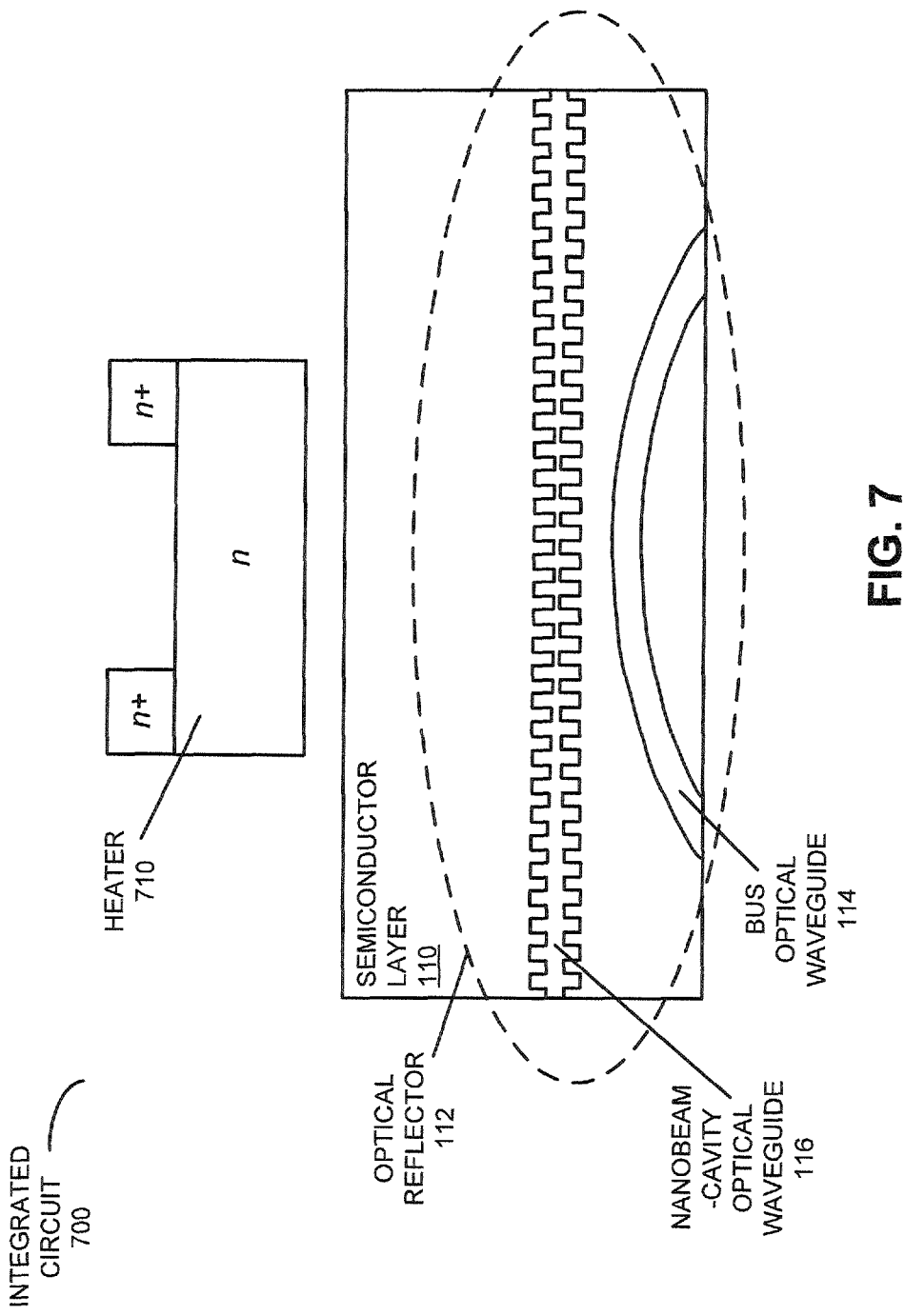
FIG. 7 is a block diagram illustrating a top view of an integrated circuit in accordance with an embodiment of the present disclosure.
Figure 8:
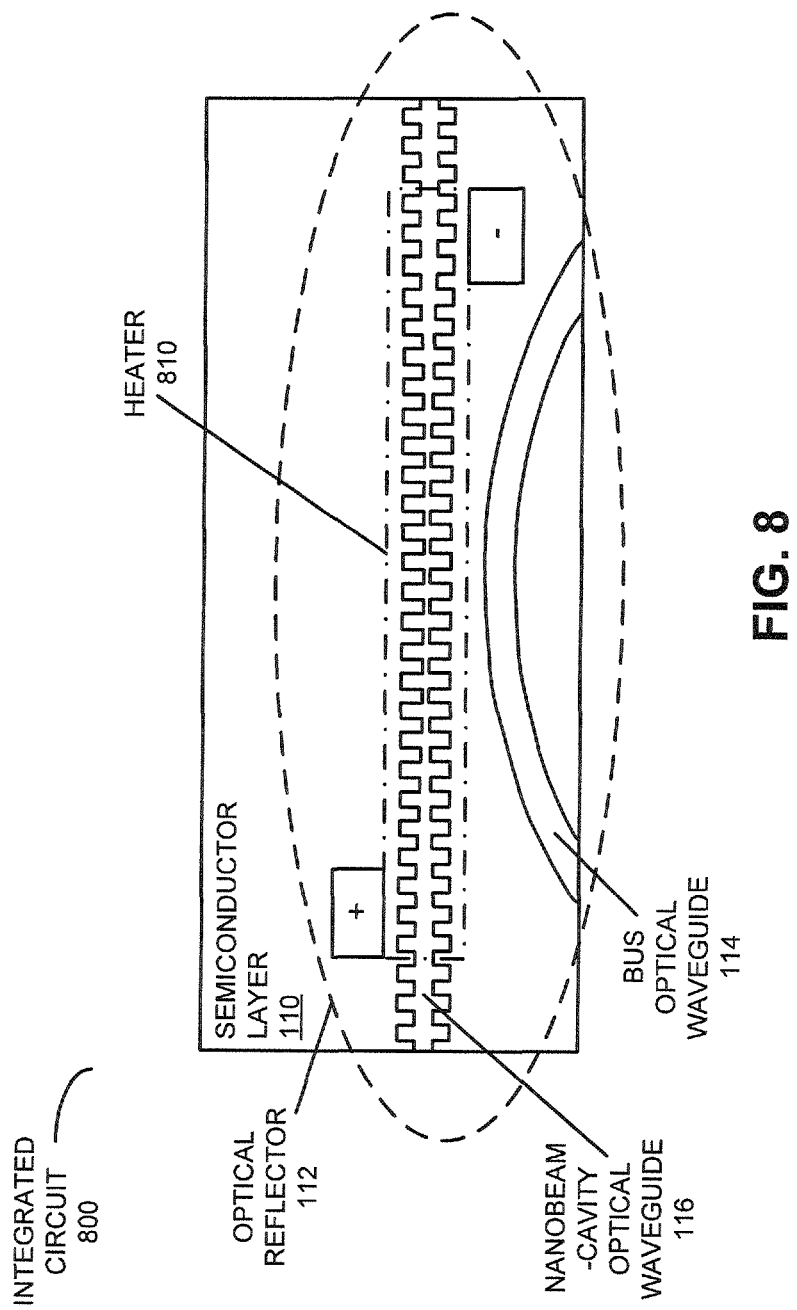
FIG. 8 is a block diagram illustrating a top view of an integrated circuit in accordance with an embodiment of the present disclosure.

The optical reflector may be thermally tuned, e.g., using a micro-heater near the cavity. This is shown in FIG. 7, which presents a block diagram illustrating a top view of an integrated circuit 700. In particular, a silicon heater 710 may be implemented by adding doping regions on the slab beside the nanobeam cavity when a ridge optical waveguide is used. Another configuration is shown in FIG. 8, which presents a block diagram illustrating a top view of an integrated circuit 800. For example, a metal heater 810 (such as nickel chromium) may be defined on top of the nanobeam cavity with a dielectric layer in between to prevent optical absorption by metal. In an exemplary embodiment, a thermal tuning efficiency of 100 pm/C can be achieved. Note that the light that is out-of-band (and, thus, that is not reflected by the optical reflector) may be measured by monitors and used in a feedback loop to thermally tune the reflection wavelength of the optical reflector.

Figure 9:
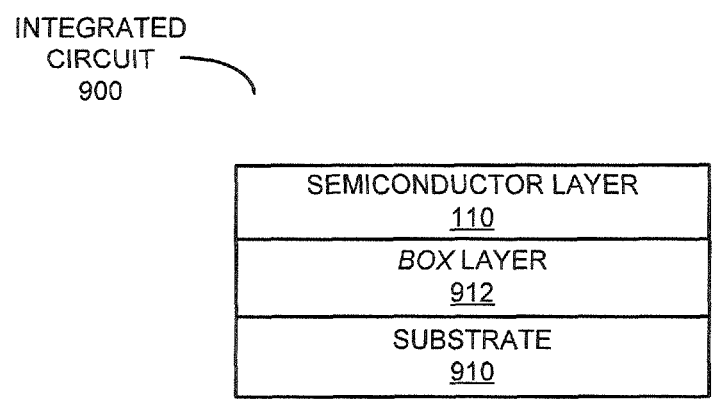
FIG. 9 is a block diagram illustrating a side view of an integrated circuit in accordance with an embodiment of the present disclosure.

The optical reflector may be implemented using a silicon-on-insulator (SOI) technology or platform. This is shown in FIG. 9, which presents a block diagram illustrating a side view of an integrated circuit 900. This integrated circuit includes: a substrate 910, a buried-oxide (BOX) layer 912 disposed on substrate 910, and semiconductor layer 110 disposed on BOX layer 912, where semiconductor layer 110, at least in part, includes the optical reflector. Thus, substrate 910 may include silicon, BOX layer 912 may include silicon dioxide and semiconductor layer 110 may include silicon.

In an exemplary embodiment, the fundamental or carrier wavelength of an optical signal in the optical reflector is between 1.1-1.7 μm. For example, the optical signal may have a fundamental or a carrier wavelength of 1.3 or 1.55 μm. Moreover, semiconductor layer 110 may have a thickness that is less than 1 μm (such as 0.2-0.5 μm). For example, semiconductor layer 110 may have a thickness of 0.3 μm. Furthermore, BOX layer 912 may have a thickness between 0.3 and 3 μm (such as 0.8 μm).

The optical reflector may be used to, at least in part, to define an optical cavity in a hybrid external cavity laser. This is shown in FIG. 10, which presents a block diagram illustrating a side view of a hybrid external cavity laser 1000. In particular, optical reflector 1010 may be at one end of optical cavity 1012 in hybrid external cavity laser 1000, and a reflector (such as a mirror) in RSOA 1014 (such as a IIIV semiconductor RSOA) may be at the other end.

In summary, the optical reflector in the integrated circuit may have a high Q factor (or low loss) and may be single-mode with a narrow-bandwidth. In addition, the optical reflector may be compact or may have a small size, and may have a small power consumption. Therefore, the integrated circuit may allow wavelength-division-multiplexing silicon photonics to be used in low-cost, high-density optical interconnect applications.

Figure 11:
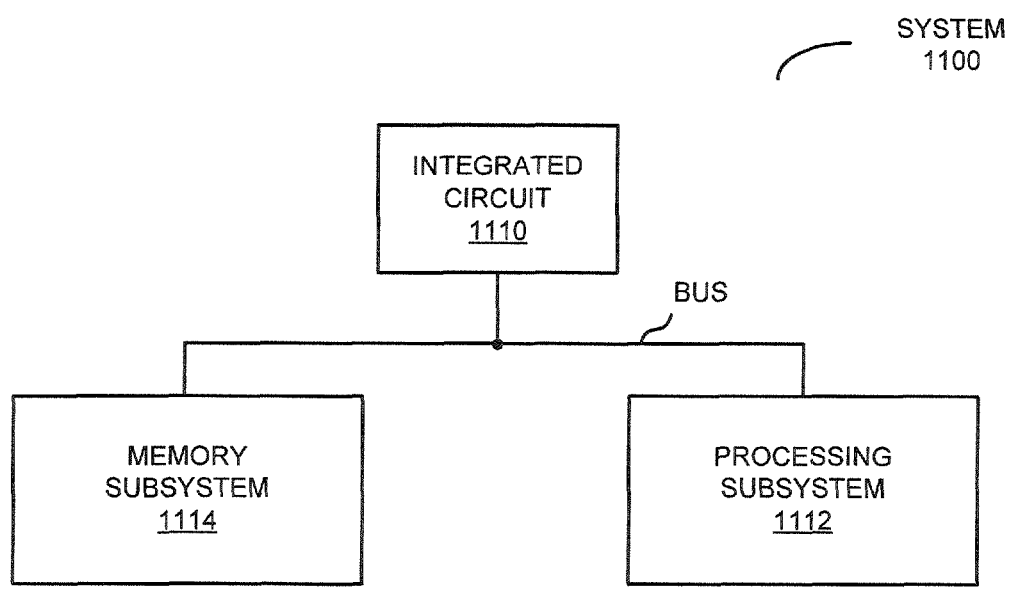
FIG. 11 is a block diagram illustrating a system that includes an integrated circuit in accordance with an embodiment of the present disclosure.

FIG. 11 presents a block diagram illustrating a system 1100 (or an electronic device) that includes an integrated circuit 1110, which may one of the previous embodiments of the integrated circuit in FIGS. 1-10. In some embodiments, system 1100 includes processing subsystem 1112 (with one or more processors) and memory subsystem 1114 (with memory).

In general, functions of integrated circuit 1110 and system 1100 may be implemented in hardware and/or in software. Thus, system 1100 may include one or more program modules or sets of instructions stored in a memory subsystem 1114 (such as DRAM or another type of volatile or non-volatile computer-readable memory), which, during operation, may be executed by a processing subsystem 1112. Note that the one or more computer programs may constitute a computer-program mechanism. Furthermore, instructions in the various modules in memory subsystem 1114 may be implemented in: a high-level procedural language, an object-oriented programming language, and/or in an assembly or machine language. Note that the programming language may be compiled or interpreted, e.g., configurable or configured, to be executed by the processing subsystem.

Components in system 1100 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 1100 may be at one location or may be distributed over multiple, geographically dispersed locations.

System 1100 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Moreover, integrated circuit 1110 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of integrated circuit 1110 and/or system 1100 may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, integrated circuit 1110 and/or system 1100 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the optical reflection technique may be used with other materials (such as germanium and/or silicon germanium), as is known to one of skill in the art. Moreover, the semiconductor layer may include polysilicon or amorphous silicon. Furthermore, the materials and compounds in integrated circuit 1110 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical reflector and/or integrated circuit 1110. Furthermore, a wide variety of optical sources may be integrated with or included in integrated circuit 1110, including many different types of lasers or non-laser optical sources (such as a light-emitting diode).

In some embodiments, the nanobeam cavity is implemented by etching holes in the center of one or more optical waveguides and by adjusting the hole size to form the nanobeam cavity. Alternatively or additionally, apodization of gratings can be performed to reduce insertion loss and in order to obtain a more-selective minor for a hybrid external cavity laser. Note that apodization may be implemented by varying the width of the nanobeam optical waveguide.

Figure 12:
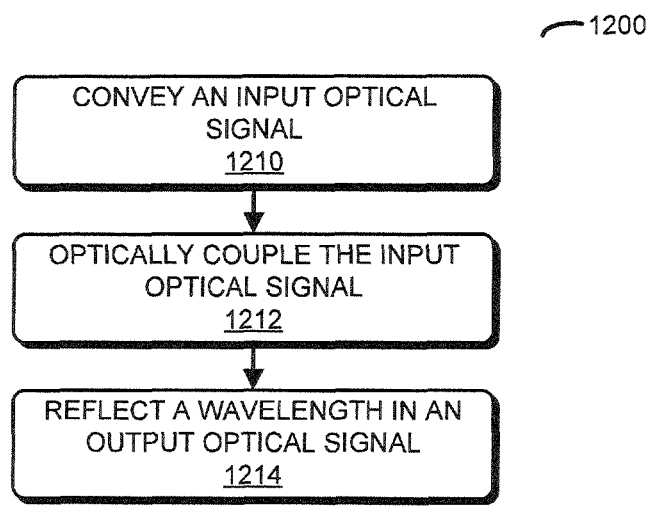
FIG. 12 is a flow chart illustrating a method for reflecting a wavelength in an output optical signal in accordance with an embodiment of the present disclosure.

We now describe embodiments of the method. FIG. 12 presents a flow chart illustrating a method 1200 for reflecting a wavelength in an output optical signal, which may be performed by an embodiment of an integrated circuit that includes an optical reflector, such as one of the integrated circuits in FIGS. 1-10. During operation, a bus waveguide in the optical reflector conveys an input optical signal (operation 1210) having multiple wavelengths, where the bus optical waveguide is defined in a semiconductor layer, the semiconductor layer is disposed on a BOX layer and the BOX layer is disposed on a substrate. Then, the input optical signal is optically coupled (operation 1212) to a nanobeam-cavity optical waveguide in the optical reflector, where the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide. Moreover, a fill factor of the notches varies as a function of location along the symmetry axis, while a pitch of the notches is unchanged, to define a nanobeam cavity. Next, the nanobeam-cavity optical waveguide reflects the wavelength in the output optical signal (operation 1214).

In some embodiments of method 1200, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
    a substrate;
    a buried-oxide (BOX) layer disposed on the substrate; and
    a semiconductor layer disposed on the BOX layer, wherein the semiconductor layer includes an optical reflector, and wherein the optical reflector includes:
        a first bus optical waveguide; and
            a nanobeam-cavity optical waveguide optically coupled to the first bus optical waveguide, wherein the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide; and
            wherein a fill factor of the notches varies as a function of location along the symmetry axis, while a pitch of the notches is unchanged, to define a nanobeam cavity.

2. The integrated circuit of claim 1, wherein the nanobeam-cavity optical waveguide includes one of: a ridge optical waveguide, and a channel optical waveguide.

3. The integrated circuit of claim 1, wherein the first bus optical waveguide is curved.

4. The integrated circuit of claim 1, wherein tapering of the nanobeam-cavity optical waveguide associated with variation of the fill factor along the symmetry axis is adiabatic.

5. The integrated circuit of claim 1, wherein the fill factor at a midpoint of the nanobeam-cavity optical waveguide is greater than fill factors at locations distal from the midpoint in either direction along the symmetry axis.

6. The integrated circuit of claim 1, wherein fill factors at locations along the symmetry axis that are symmetric about the midpoint are approximately equal.

7. The integrated circuit of claim 1, wherein the optical reflector is structured to reflect a wavelength.

8. The integrated circuit of claim 1, wherein the nanobeam-cavity optical waveguide includes less than a predefined number of notches and the optical reflector has a Q factor greater than a predefined value.

9. The integrated circuit of claim 1, wherein the optical reflector includes a second bus optical waveguide that is optically coupled to the nanobeam-cavity optical waveguide.

10. The integrated circuit of claim 9, wherein the optical coupling between the nanobeam-cavity optical waveguide and the first bus optical waveguide is different than the optical coupling between the nanobeam-cavity optical waveguide and the second bus optical waveguide.

11. The integrated circuit of claim 1, further comprising an external cavity laser, wherein the optical reflector is a reflector at one end of the external cavity laser and, in part, defines an optical cavity in the external cavity laser.

12. A system, comprising:
    a processor;
    a memory, coupled to the processor, that stores a program module, which, during operation, is executed by the processor; and
    an integrated circuit, wherein the integrated circuit includes:
        a substrate;
        a buried-oxide (BOX) layer disposed on the substrate; and
        a semiconductor layer disposed on the BOX layer, wherein the semiconductor layer includes an optical reflector, and wherein the optical reflector includes:
            a first bus optical waveguide; and
            a nanobeam-cavity optical waveguide optically coupled to the first bus optical waveguide, wherein the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide; and
            wherein a fill factor of the notches varies as a function of location along the symmetry axis, while a pitch of the notches is unchanged, to define a nanobeam cavity.

13. The system of claim 12, wherein the nanobeam-cavity optical waveguide includes one of: a ridge optical waveguide, and a channel optical waveguide.

14. The system of claim 12, wherein the first bus optical waveguide is curved.

15. The system of claim 12, wherein tapering of the nanobeam-cavity optical waveguide associated with variation of the fill factor along the symmetry axis is adiabatic.

16. The system of claim 12, wherein the fill factor at a midpoint of the nanobeam-cavity optical waveguide is greater than fill factors at locations distal from the midpoint in either direction along the symmetry axis; and wherein the fill factors at locations along the symmetry axis that are symmetric about the midpoint are approximately equal.

17. The system of claim 12, wherein the optical reflector includes a second bus optical waveguide that is optically coupled to the nanobeam-cavity optical waveguide.

18. The system of claim 17, wherein the optical coupling between the nanobeam-cavity optical waveguide and the first bus optical waveguide is different than the optical coupling between the nanobeam-cavity optical waveguide and the second bus optical waveguide.

19. The system of claim 12, further comprising an external cavity laser, wherein the optical reflector is a reflector at one end of the external cavity laser and, in part, defines an optical cavity in the external cavity laser.

20. A method for reflecting a wavelength in an output optical signal, wherein the method comprises:

conveying an input optical signal having multiple wavelengths in a bus optical waveguide defined in a semiconductor layer, wherein the semiconductor layer is disposed on a buried-oxide (BOX) layer and the BOX layer is disposed on a substrate;

optically coupling the input optical signal to a nanobeam-cavity optical waveguide, wherein the nanobeam-cavity optical waveguide includes notches along a symmetry axis of the nanobeam-cavity optical waveguide that are partially etched from edges of the nanobeam-cavity optical waveguide toward a center of the nanobeam-cavity optical waveguide; and wherein a fill factor of the notches varies as a function of location along the symmetry axis, while a pitch of the notches is unchanged, to define a nanobeam cavity; and reflecting the wavelength in the output optical signal using the nanobeam-cavity optical waveguide.

* * * * *

UNITED STATES PATENT AND TRADEMARK OFFICE
CERTIFICATE OF CORRECTION

PATENT NO. : 9,647,424 B2  
APPLICATION NO. : 14/881741  
DATED : May 9, 2017  
INVENTOR(S) : Lin et al.

Page 1 of 1

It is certified that error appears in the above-identified patent and that said Letters Patent is hereby corrected as shown below:

On the Title Page

Column 1, under Title, Line 1, delete "SINGLE MODE" and insert -- SINGLE-MODE --, therefor.

In the Specification

In Column 1, Line 1, delete "SINGLE MODE" and insert -- SINGLE-MODE --, therefor.

In Column 1, Line 34, delete "minor" and insert -- mirror --, therefor.

In Column 4, Line 18, delete "(RSOA s)" and insert -- (RSOAs) --, therefor.

In Column 6, Line 59, delete "IIIIV" and insert -- III/V --, therefor.

In Column 8, Line 57, delete "minor" and insert -- mirror --, therefor.

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*